United States Patent
Rutiser

(10) Patent No.: US 6,745,462 B2
(45) Date of Patent: Jun. 8, 2004

(54) METHOD AND APPARATUS FOR REDUCING DEFORMATION OF ENCAPSULANT IN SEMICONDUCTOR DEVICE ENCAPSULATION BY STENCIL PRINTING

(75) Inventor: Claire Rutiser, Willow Grove, PA (US)

(73) Assignee: Kulicke & Soffa Industries, Inc., Willow Grove, PA (US)

( * ) Notice: Subject to any disclaimer, the term of this patent is extended or adjusted under 35 U.S.C. 154(b) by 195 days.

(21) Appl. No.: 10/092,459

(22) Filed: Mar. 7, 2002

(65) Prior Publication Data

US 2003/0167633 A1 Sep. 11, 2003

(51) Int. Cl.⁷ ................................................. H05K 3/30
(52) U.S. Cl. .............................. 29/841; 29/739; 29/740; 29/932; 29/840; 174/52.2; 174/52.3; 257/782; 257/783; 438/102; 438/107
(58) Field of Search ......................... 29/840, 841, 825, 29/832, 739, 740; 174/52.2, 52.3; 257/782, 783; 438/106, 107

(56) References Cited

U.S. PATENT DOCUMENTS

| | | | |
|---|---|---|---|
| 4,864,470 A | 9/1989 | Nishio | 361/400 |
| 4,872,261 A | 10/1989 | Sanyal et al. | 29/840 |
| 5,120,678 A | 6/1992 | Moore et al. | 437/183 |
| 5,192,334 A | 3/1993 | Rohr et al. | 29/623.5 |
| 5,669,137 A | 9/1997 | Ellerson et al. | 29/840 |
| 5,866,953 A | 2/1999 | Akram et al. | 257/790 |
| 5,891,753 A | 4/1999 | Akram | 438/108 |
| 5,962,810 A | 10/1999 | Glenn | 174/52.2 |
| 6,117,705 A | 9/2000 | Glenn et al. | 438/106 |
| 6,225,704 B1 | 5/2001 | Sumita et al. | 257/789 |
| 6,372,544 B1 | 4/2002 | Halderman et al. | 438/108 |
| 6,391,762 B1 | 5/2002 | Gamota et al. | 438/618 |
| 6,439,115 B1 | 8/2002 | Michiels et al. | 101/129 |
| 6,448,635 B1 | 9/2002 | Glenn | 257/676 |
| 6,459,164 B2 | 10/2002 | Nagerl et al. | 257/795 |
| 6,534,858 B2 | 3/2003 | Akram et al. | 257/706 |

OTHER PUBLICATIONS

International Search Report for PCT/US03/07017 dated Jul. 2, 2003.

*Primary Examiner*—Carl J. Arbes
(74) *Attorney, Agent, or Firm*—Synnestvedt & Lechner LLP

(57) ABSTRACT

The invention is a method and apparatus for encapsulating semiconductor dies via stencil printing in which, after the dies have been stencil printed with encapsulant and prior to removal of the stencil from the dies, the edges of the encapsulating material are partially cured in order to prevent or minimize slump of the encapsulant in the time period between removal of the stencil and full curing of the encapsulant. In particular, the stencil can be provided with a plurality of light pipes that terminate at the edges of the apertures within which the dies are placed. Ultraviolet (UV) or other curing light is provided through the light pipes to the edges of the encapsulating material. Some general or localized heating can be provided to enhance or accelerate the light curing of the edges of the encapsulant, but without substantially curing the remainder of the encapsulating material.

37 Claims, 4 Drawing Sheets

METHOD AND APPARATUS FOR REDUCING DEFORMATION OF ENCAPSULANT IN SEMICONDUCTOR DEVICE ENCAPSULATION BY STENCIL PRINTING

FIELD OF THE INVENTION

The invention pertains to semiconductor die and other device packaging. More particularly, the invention pertains to encapsulation of semiconductors and other devices by stencil printing.

BACKGROUND OF THE INVENTION

Stencil printing was originally introduced to the semiconductor field for use in placing small formations, such as solder bumps, on the surfaces of semiconductor dies. Essentially, the semiconductor dies were placed under stencils or screens with apertures corresponding to the places on the surfaces of the die where, for example, solder bumps were to be placed. The depth or height dimension of the stencil is selected to be equal to the desired height of the solder bumps. A viscous solder paste is then applied over the stencil with a wiper or squeegee oriented at an acute angle to the top surface of the stencil. The squeegee traverses the stencil and pushes the solder paste ahead of it as well as down into the apertures, thus depositing the solder paste in the desired locations of the solder bumps on the surface of the semiconductor die. The stencil is then removed.

Some have attempted to use stencil printing in other applications pertaining to semiconductors. Particularly, stencil printing has been attempted for encapsulating semiconductor dies. A stencil printing process for encapsulation of semiconductor dies might involve placing a plurality of dies on a substrate in a regular rectangular pattern such that there are a plurality of parallel vertical streets and a plurality of parallel horizontal streets defining the spaces between the dies. It should be understood that the terms vertical and horizontal are arbitrary and are not intended to define any particular orientation of the streets to the horizon, but merely that the two sets of streets are more or less orthogonal to each other. The terms horizontal and vertical are used herein because they are the terms generally used by persons in the related arts. A stencil is then rested on the substrate so that the dies appear in the apertures of the stencil.

Each die may correspond to a separate aperture in the stencil, such that the streets are defined by the spaces between the apertures in the stencil. However, more likely, each aperture in the stencil will contain a plurality of dies laid out in a rectangular pattern. The stencil may have a plurality of such apertures also laid out in a rectangular pattern.

The encapsulant is applied into the apertures as described above using a squeegee that runs over the stencil and forces the epoxy into the apertures in the stencil, covering all sides of the dies therein, except for the side face down and in contact with the substrate. Depending on the particular process, the dies may be placed face up or face down on the substrate. In either event, the surface that is face down on the substrate does not get covered with the encapsulant. However, all of the other sides do. The substrate itself will act as the protective cover for the face down side of the die.

In semiconductor fabrication, the encapsulating material typically is a relatively high viscosity liquid epoxy that must be cured after the stencil printing in order to harden it into its final form. Accordingly, the stencil is then removed and the workpiece, comprising a substrate bearing a plurality of dies captured within uncured epoxy, is placed in a curing oven to heat cure and harden the encapsulating material. Typically, a plurality of these workpieces are cured simultaneously in the curing oven. The number of workpieces cured simultaneously depends on many factors, including the size of the oven, and may range anywhere from dozens to tens of thousands.

After curing, the workpiece is diced along the horizontal and vertical streets in order to separate the encapsulated semiconductor chips from each other.

In encapsulation applications, the apertures in the stencils obviously are much larger than in solder bumping applications The size of the apertures when stencil printing is used for encapsulation of semiconductor dies can range as high several inches across each side (assuming a square or rectangular aperture, for example). Rectangular apertures of two to six inches per side (e.g., 4 to 36 square inches) for accommodating 16 to 25 dies in each aperture is exemplary. Common sizes include 0.75"×0.75" and 2"×2". The stencil apertures should have a height equal to the height of the dies plus the desired depth of the encapsulant on the top surface of the dies. On the other hand, the apertures found in stencil printing for solder bumping typically will be generally circular and range in diameter from about 50 to 100 microns and be much less in height.

The viscosities of presently available encapsulating materials for semiconductor dies range from about 50,000 centipoise to about 1,000,000 centipoise. However, due to any number of circumstances, there may be a lengthy delay between removal of the stencil from the substrate/dies and final curing, during which time the viscous liquid epoxy encapsulating material can slump or flow. For instance, at many manufacturing facilities, the number of available stencils accommodates far fewer dies than can be cured simultaneously in the curing oven. Accordingly, the stencils are removed from a first set of dies and reused before the first set of dies are placed in the oven for curing. It would not be uncommon for the delay between removal of the dies from the stencil until curing to be several hours. Accordingly, semiconductor manufactures often must select the particular encapsulating material for a given application based, at least partially, on it having a sufficiently high viscosity to minimize slump during this delay period. This problem becomes more acute as the size of the workpiece increases (as the size of the apertures in the stencil increase) or as the height of the encapsulation increases.

Accordingly, if there might be any significant delay between removal of the stencil and final curing of the encapsulant, the semiconductor manufacturer likely will need to select an encapsulating material with a viscosity of at least about 300,000 centipoise in order to minimize slump.

Several stencil printing machine manufacturers now offer stencil printing machines for solder bumping in which the solder paste is contained in a pressurized vessel so that the solder paste is more forcibly injected into the apertures in the stencil. One such line of machines is the Horizon series of stencil printing machines manufactured by DEK, Inc. of Surrey, England, which includes, among others, the Horizon 265 model. In such stencil printing machines, the solder paste is contained in a pressurized vessel to pressurize the solder paste. At the bottom of the vessel is a printing head that includes a long, narrow slot with two wipers or squeegees, one on each longitudinal side of the slot. The slot and wipers ride over the stencil forcing the paste out of the slot into the apertures in the stencil.

It is an object of the present invention to provide an improved stencil printing apparatus.

It is another object of the present invention to provide an improved method for encapsulating semiconductor dies or other devices using stencil printing.

It is a further object of the present invention to provide an improved stencil printing apparatus for encapsulating semiconductor dies or other devices.

It is yet a further object of the present invention to provide an improved apparatus for encapsulating semiconductors using stencil printing.

SUMMARY OF THE INVENTION

In accordance with the present invention, semiconductor dies and other devices are encapsulated using a stencil printing technique in which, during and/or after the dies have been stencil printed with encapsulant and prior to removal of the stencil from the dies, the edges of the encapsulant are partially light cured in order to prevent or reduce slump of the encapsulant in the time period between removal of the stencil and curing of the encapsulant. In particular, the stencil is provided with a plurality of light pipes that terminate at the edge walls defining the apertures within which the dies are placed. Ultraviolet (UV) or other curing light is provided through the light pipes to the edges of the encapsulating material. The light cures just the edges of the encapsulating material so that the stencil can be removed without the encapsulating material slumping. This enables semiconductor chip manufacturers the flexibility to use lower viscosity encapsulating materials and/or to increase the delay period between removal of the encapsulated dies from the stencil and curing of the encapsulating material since the encapsulating material will not slump because the edges are partially cured.

The light pipes may comprise channels in the stencil body with optical fibers therein. While it is within the scope of the invention for the stencils to have self-contained light sources within the body of the stencil for providing the light into the light pipes, in more preferred embodiments, the opposite ends of the light pipes terminate on or near the outer edge of the stencil where they can be mated to an external light source, such as a UV light source.

In other embodiments, the pipes may comprise hollow channels with high-reflectivity coating on the walls thereof. In even further embodiments, the entire stencil may be fabricated of a material, such as acrylic or polyethylene terephthalate glycol (PETG), that is transparent to UV light, whereby the entire stencil essentially is a large light pipe. An opaque or reflective coating (the reflective side facing inwardly of the stencil) may be applied to all surfaces other than the vertical surfaces defining the apertures in order to prevent light from escaping from the stencil at surfaces other than the surfaces at the apertures.

Optionally, some general or localized heating can be provided to enhance or accelerate the light curing of the edges of the encapsulant, but without substantially curing the rest of the encapsulant.

BRIEF DESCRIPTION OF THE DRAWINGS

FIGS. 4, 5, and 6 are pictorial representations of an apparatus for partially curing the edges of the encapsulating material during stencil printing encapsulation processes in accordance with various alternate embodiments of the present invention.

DETAILED DESCRIPTION OF THE INVENTION

Figure 1:
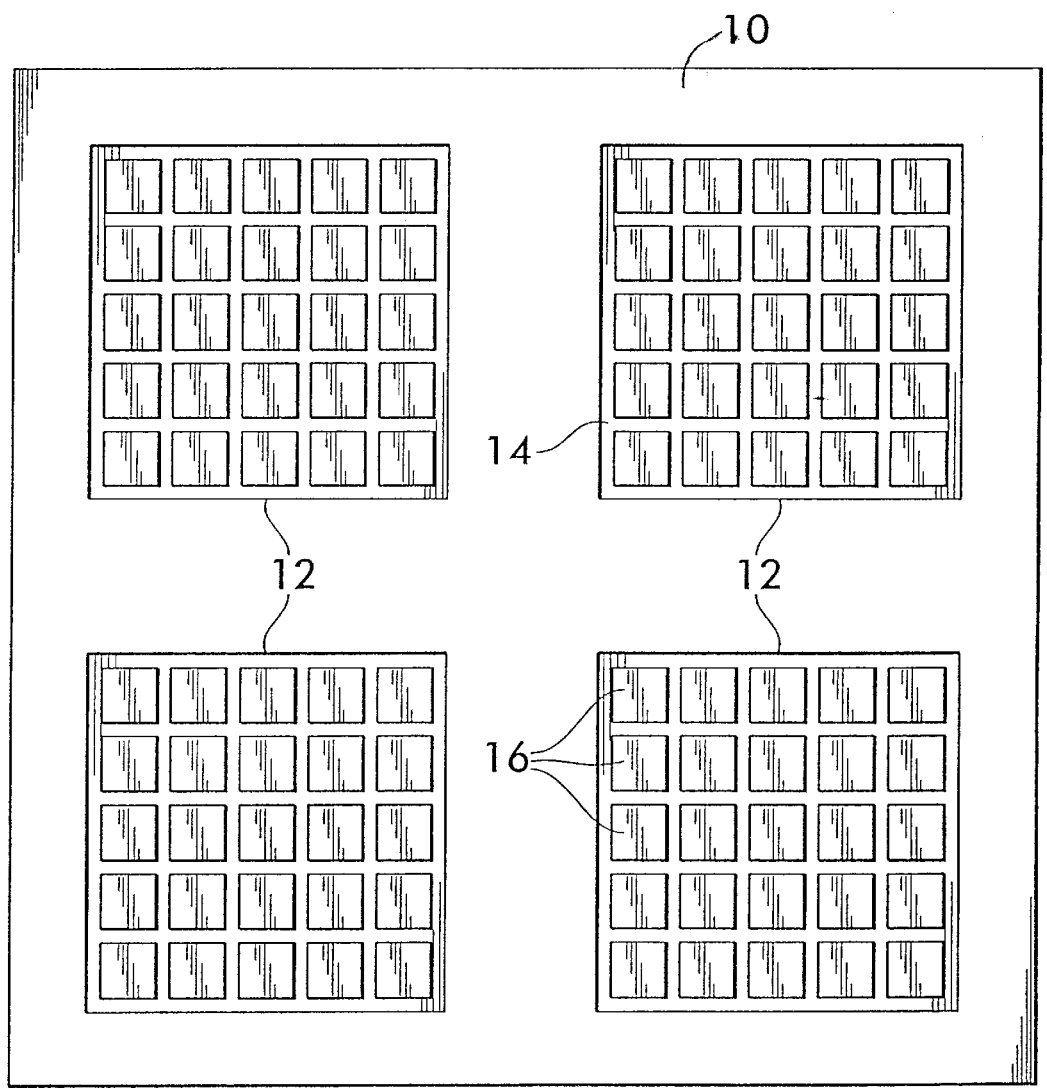
FIG. 1 is a plan view of a stencil mounted over a substrate bearing a plurality of dies ready for encapsulation by stencil printing.

FIG. 1 is a plan view of a plurality of semiconductor dies 16 positioned on a substrate 14 with a stencil 10 thereover. As can be seen, the stencil is a frame defining a plurality of apertures or windows 12. The dies 16 are arranged in apertures 12. In this example, each aperture surrounds twenty five dies arranged in a five by five matrix. This arrangement is merely exemplary of a typical stencil design and is not limiting. There may be any number of dies in each aperture, including one die per aperture, and any number of apertures per stencil, including one. The dies are laid on top of the substrate 14, which can be seen through the apertures 12 in the streets between the dies. Typically, the stencil overlies the entire substrate. However, it is possible for the substrate to have an area larger than the stencil. This substrate/stencil/dies assembly is ready for the encapsulation process. The dies may be encapsulated in accordance with the present invention using any type of stencil printing machine, including a first generation type stencil printing machine in which the encapsulating material is applied by squeegee as well as the newer pressurized dispenser type stencil printing machines. Alternately, a pump or syringe could dispense material into the stencil apertures.

Figure 2:
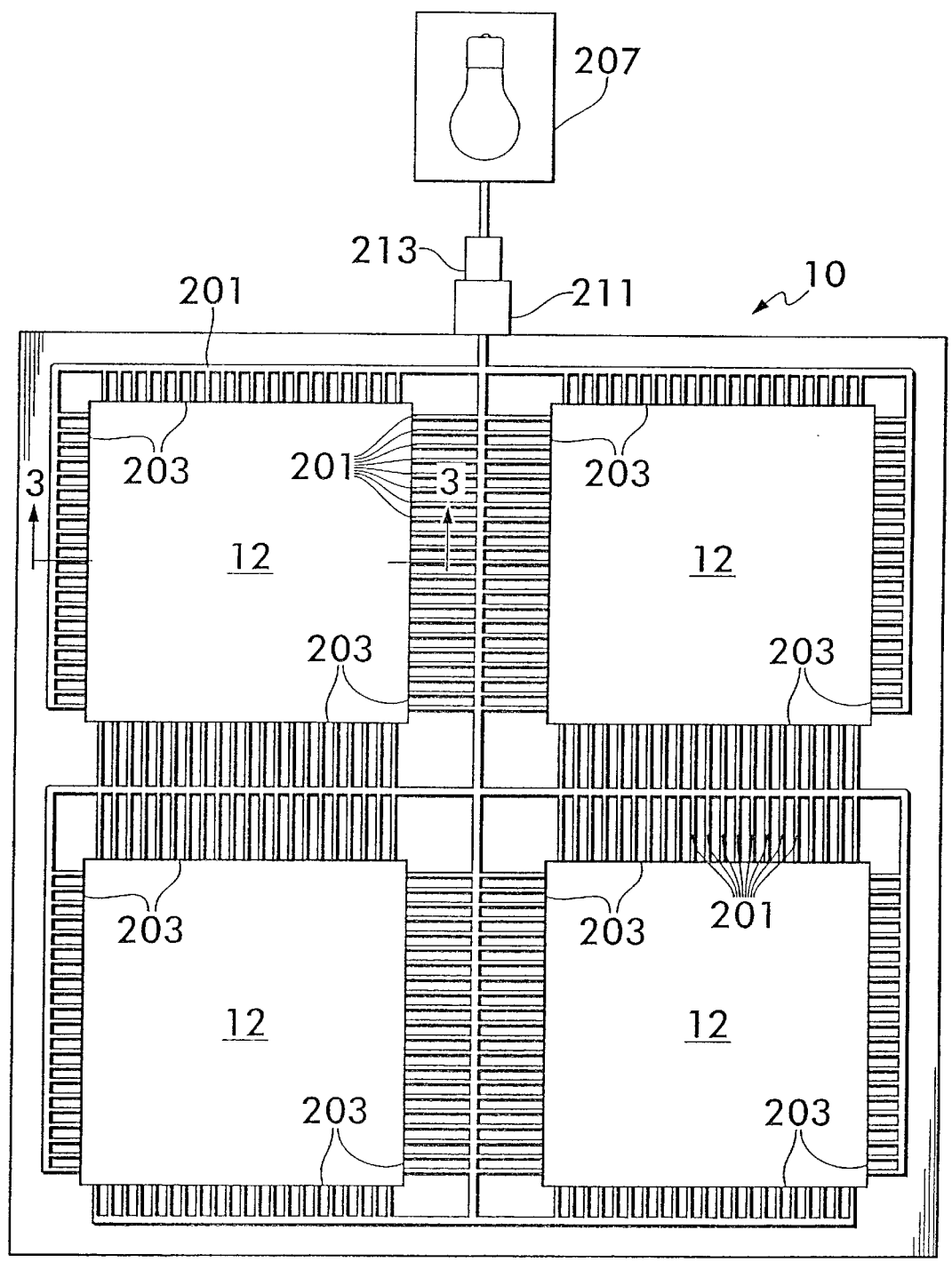
FIG. 2 is a pictorial representation of an apparatus for partially light curing the edges of the encapsulating material during stencil printing encapsulation processes in accordance with the present invention.
Figure 3:
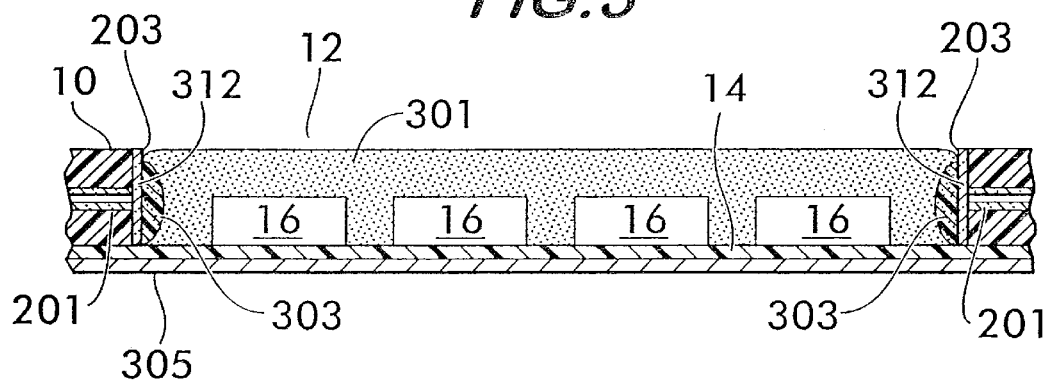
FIG. 3 is a cross-sectional side view of an apparatus for partially light curing the edges of the encapsulating material during stencil printing encapsulation processes in accordance with the present invention.

FIG. 2 is a pictorial diagram of a stencil in accordance with the present invention in cross-sectional plan view illustrating the basic concept of the present invention. FIG. 3 is a cross-sectional elevation view taken along line 3—3 of FIG. 2. However, FIG. 3 illustrates a later stage of the process and, particularly, the stage after encapsulating material has been applied to dies in the stencil and the edges of the encapsulating material have been partially cured in accordance with the present invention. Reference should be made to both FIGS. 2 and 3 in connection with the following discussion. Referring first to FIG. 2, the stencil 10 is provided with a plurality of light pipes 201 that run through the body of the stencil to the vertical walls 203 of the apertures 12. Either internally of the stencil, or more preferably, externally of the stencil, one or more light sources 207 are coupled to the light pipes 201. If external, the light source 207 can be provided as part of or as a separate unit from the stencil printing machine. The wavelength of the light source 207 should be selected to optimize curing of the encapsulating materials and preferably be specifically adapted to the particular encapsulating material being used in the application. Many light curable encapsulating materials cure in the blue or ultraviolet light wavelength ranges. The light pipes 201 carry light from the light source 207 to the walls 203 of the apertures 12.

The light pipes 201 may be small channels running from the perimeter 209 of the stencil to the walls 203 of the apertures and may have optical fibers therein for carrying the light over potentially curved paths to the walls 203 of the apertures. For UV curable epoxy, quartz fiber optics or a liquid-filled light guide would be preferable over standard optical fibers. The stencil 10 may include one or more optical connectors 211 for connecting to the external light source(s) 207 through a mating optical connector 213. The optical connectors 211 and 213 may comprise any standard optical connector, such as an SC, ST, SL, FODI, and ESCON connector, all of which are well recognized optical connector types in accordance with international standards.

In other embodiments, the pipes may comprise hollow channels with high-reflectivity coating on the walls thereof. In even further embodiments, the entire stencil may be fabricated of a material, such as acrylic or polyethylene terephthalate glycol (PETG), that is transparent to UV light, whereby the entire stencil essentially is a large light pipe. An opaque or reflective coating (the reflective side facing inwardly of the stencil) may be applied to all surfaces other than the vertical surfaces defining the apertures in order to prevent light from escaping from the stencil at surfaces other than the surfaces at the apertures.

Referring now to FIG. 3, the stencil, substrate and dies assembly has been processed through a stencil printing machine. Accordingly, the aperture 12 contains multiple dies 16 and has been filled with liquid encapsulant 301. Further, either during and/or after the process of filling the aperture 12 with the encapsulant 301, light has been applied to the edges 203 of the aperture through light pipes 201. Accordingly, the portions 303 of the liquid encapsulating material 301 adjacent the edges have been partially light cured and, thus, hardened. Hence, the encapsulating material will not slump when the stencil is removed.

The liquid encapsulating material 301, of course, comes in contact with the walls 203 of the apertures 12. Accordingly, there must be a fluid tight, yet substantially light transmissive, seal between the ends of the light pipes 201 and the walls of the apertures. The seal may comprise a sheet, plate or other layer 312 of a polymer that is substantially transparent or translucent to the relevant wavelengths of the curing light. The surface of the sheet, plate or layer that faces the light pipes may be coated with an anti-reflection coating in order to maximize the amount of light that reaches the liquid encapsulating material.

The invention can be applied in connection with any type of stencil printing system, including squeegee blade and pressurized dispenser stencil printing.

Preferably, the light source 207 is not activated until the apertures 12 has been fully filled with the encapsulating material. At that time, the light source 207 is turned on and the edges 303 of the encapsulating material 301 are cured.

Because some encapsulating materials are substantially translucent or transparent, the curing light applied to the edges of the apertures will, in most cases, cause curing throughout a small volume of the encapsulating material that surrounds the end of the light pipe and that is larger than the cross sectional area of the light pipe itself.

In theory, the area of curing corresponding to each light pipe terminating on the edge of an aperture should be substantially hemispherical, such as illustrated by areas 303 in FIG. 3, with the amount of curing being greatest immediately adjacent the end of the light pipe and decreasing as the distance from the light pipe increases. Accordingly, the plurality of light pipe termination points at the walls of the apertures should be positioned close enough to each other to ensure partial curing of the entire edge of the encapsulating material in order to best achieve the goal of preventing slumping or other deformation after removal of the stencil. Of course, the amount of curing that will occur depends on many factors in addition to the spacing of the light pipe ends from each other, including, but not limited to, the power of the light source 207, whether or not additional heating is applied, how much additional heat is applied, the duration of the light curing, the particular wavelength of the light source, and the properties of the particular encapsulating material, such as its translucence and susceptibility to light curing.

The assembly of the substrate 14, dies 12, stencil 10 and liquid encapsulating material 301 may be heated in order to accelerate the light curing of the edges. The heating may be local to the edges which are being cured or may be a generalized heating of the entire assembly. For instance, FIG. 3 illustrates an embodiment in which generalized heating is applied. Specifically, the substrate 14 is placed on a hot-plate 305 that heats the substrate so that heat will radiate upwardly through the substrate 14 into the encapsulating material 301.

Figure 4:
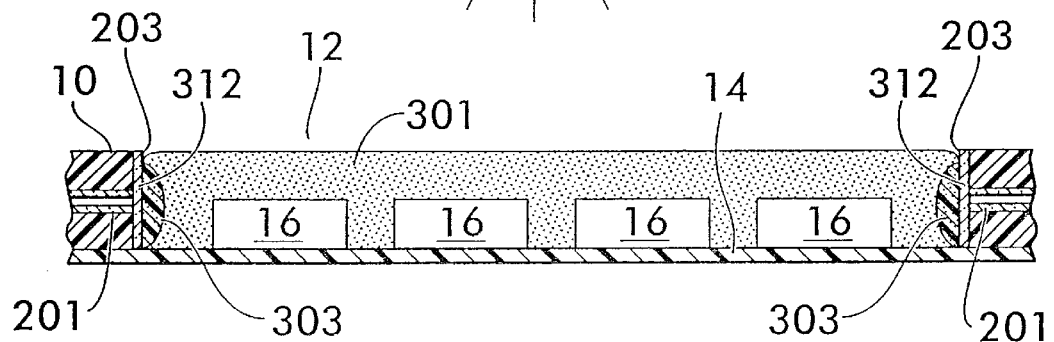

Alternately, FIG. 4 illustrates an embodiment in which a second light source 401 is positioned above the assembly to apply heat to the encapsulating material 301. The wavelength(s) of the second light source 401 should be adapted to primarily generate heat rather than to light cure the encapsulant. Visible red light or infrared light typically provides reasonably efficient heating. The second light source 401 may apply heat generally over the entire assembly or may be a laser light source specifically directed at the edges of the encapsulating material which are to be cured.

Figure 5:
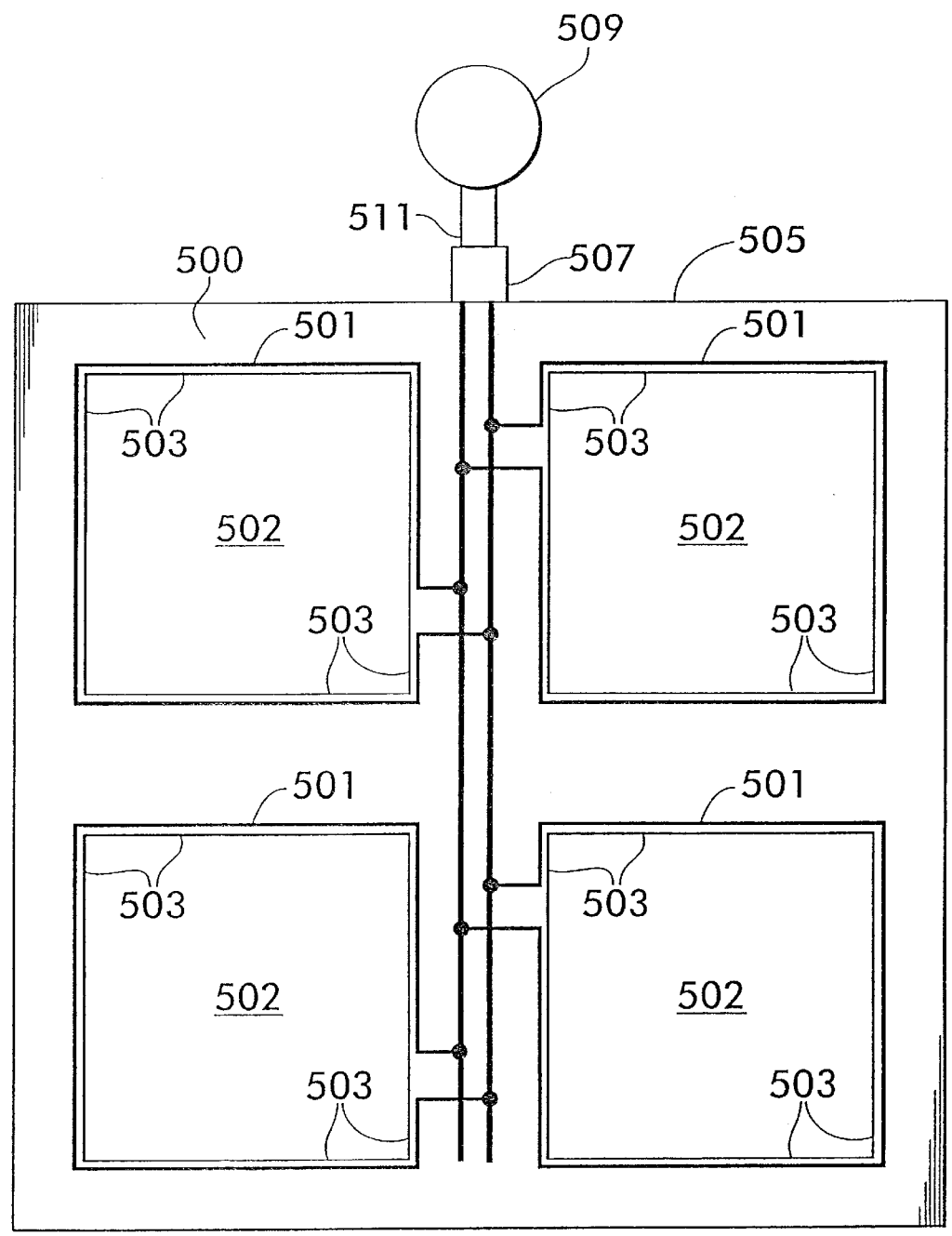

FIG. 5 is a cross-sectional plan view of a stencil 500 illustrating an even further embodiment in which heating filaments 501 are incorporated in the stencil 500 adjacent the edge walls 503 of the apertures 502. The light pipes are omitted in FIG. 5 in order not to obfuscate the illustration of the heating filaments. The heating filaments 501 may be electrical wires embedded within the stencil body adjacent the walls 503 of the apertures 502. The wires may terminate near the outside edge 505 of the stencil at an electrical connector 507 that may be coupled to a electric current source 509 through a mating electrical connector 511 for applying electricity to heat the filaments.

Presently, suitable encapsulating materials for semiconductor applications have viscosities anywhere from about 50,000 to 1,000,000 centipoise. However, in many real world practical semiconductor manufacturing environments, it is believed that it would be difficult to use any encapsulating material having a viscosity less than about 300,000 centipoise in order to assure that the encapsulating material does not slump during the longest reasonable period between removal of the stencil from the encapsulated dies until heat curing. The present invention solves this problem by partially or fully curing the edges of the encapsulating material to eliminate or drastically reduce slumping prior to heat cure. Thus, manufacturers are free to choose the most appropriate encapsulating material for their particular applications without the need to be concerned about the viscosity being high enough to prevent slump.

While the invention has heretofore been described in connection with the encapsulation of semiconductor dies and, indeed, that is considered to be its most common application, the invention can be applied in connection with encapsulation of any device. The present invention may be applied to virtually any type of semiconductor packaging system including stacked semiconductor devices, chip scale packages (CSPs), multichip modules, chip on board, face down ball grid array (BGA), flip chip packages, fine-pitch ball grid array (FBGA), and plastic ball grid array (PBGA).

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

I claim:

1. A method of encapsulating devices, said method comprising the steps of:
   (1) placing said device on a substrate;
   (2) placing over said substrate and said device a stencil with an aperture, said aperture defining a volume surrounding said device;
   (3) introducing encapsulating material into said volume; and
   (4) at least partially curing an edge of said encapsulating material so that it will not slump when said stencil is removed.

2. The method of claim 1 wherein step (4) comprises light curing.

3. The method of claim 2 wherein said device is a semiconductor die.

4. The method of claim 2 wherein said device is a stacked semiconductor device.

5. The method of claim 2 wherein said device is a fine pitch ball grid array semiconductor device.

6. The method of claim 2 wherein said device is a plastic ball grid array semiconductor device.

7. The method of claim 2 wherein said device is a chip scale package semiconductor device.

8. The method of claim 2 wherein said device is a mulitchip module semiconductor device.

9. The method of claim 2 wherein said device is a chip on board semiconductor device.

10. The method of claim 2 wherein said device is a face down ball grid array semiconductor device.

11. The method of claim 2 wherein said device is a flip chip semiconductor device.

12. The method of claim 3 wherein said stencil comprises a plurality of apertures, each surrounding a plurality of said dies.

13. The method of claim 2 wherein said aperture has at least one wall defining said volume and wherein step (4) comprises at least partially curing a portion of said encapsulating material near said wall of said aperture.

14. The method of claim 13 wherein said stencil includes a plurality of light pipes terminating at said wall and wherein step (3) comprises introducing light into said light pipes and therethrough to said edge of said encapsulating material.

15. The method of claim 14 further comprising the step of:
   (5) heating said encapsulating material during step (4).

16. The method of claim 14 further comprising the step of:
   (6) heat curing said encapsulating material after step (4).

17. The method of claim 16 further comprising the step of;
   (7) removing said stencil prior to step (6).

18. A stencil for use in encapsulating devices in an encapsulating material comprising:
   a frame;
   an aperture in said frame, said aperture of a size and shape to surround a device to be encapsulated, said aperture having a wall defining a volume for said encapsulating material; and
   at least one light pipe in said stencil terminating at said wall of said aperture.

19. The stencil of claim 18 wherein said wall of said aperture includes a substantially light transmissive layer covering at least said termination of said light pipe.

20. The stencil of claim 19 further comprising a curing light source in said stencil.

21. The stencil of claim 18 further comprising an optical connector having a first terminal optically coupled to said light pipes and a second terminal for optically coupling an external curing light source to said optical pipes.

22. The stencil of claim 18 wherein said at least one light pipe comprises a plurality of optical fibers.

23. The stencil of claim 18 wherein said at least one light pipe comprise quartz fiber.

24. The stencil of claim 18 wherein said at least one light pipe comprise a plurality of liquid-filled light guides.

25. The stencil of claim 18 wherein said stencil is fabricated at least partially of a material that is substantially transparent to light of a wavelength for curing said encapsulating material, wherein said substantially transparent material of said stencil comprises said at least one light pipe.

26. The stencil of claim 25 wherein said stencil is fabricated entirely of said transparent material.

27. The stencil of claim 25 wherein said transparent material is acrylic.

28. The stencil of claim 25 wherein said transparent material is polyethylene terephthalate glycol.

29. The stencil of claim 25 further comprising a substantially opaque layer on surfaces of said transparent material other than those surfaces of said transparent material that comprise said wall of said aperture.

30. The stencil of claim 29 wherein said opaque layer comprises a substantially reflective layer.

31. The stencil of claim 18 further comprising heating filaments adjacent said wall of said aperture.

32. An apparatus for encapsulating devices in encapsulating material comprising said stencil of claim 18 and further comprising:
   a light source for generating light of a wavelength adapted to cure said encapsulating material coupled to supply light into said light pipes.

33. The apparatus of claim 32 wherein said light source is external of said stencil, said apparatus further comprising:
   a first optical connector on said stencil and in optical communication with said optical pipes, said first optical connector having a terminal;
   a second optical coupler in optical communication with said light source and having an optical terminal adapted to mate with said terminal of said first optical coupler so that light from said light source can be provided into said optical pipes.

34. An apparatus for encapsulating devices in an encapsulating material comprising said stencil of claim 18 and further comprising means for applying heat at least adjacent said wall of said aperture.

35. The apparatus of claim 34 wherein said means for applying heat comprises a hot-plate upon which said stencil and device and a substrate may be placed.

36. The apparatus of claim 34 wherein said means for applying heat comprises heating filaments in said stencil adjacent said wall of said aperture.

37. The apparatus of claim 34 wherein said means for applying heat comprises a heating light source.

* * * * *